United States Patent [19]

Sugiyama

[11] Patent Number: 5,278,420
[45] Date of Patent: Jan. 11, 1994

[54] SCANNING CONTROL SYSTEM INVOLVED IN AN ION-IMPLANTATION APPARATUS

[75] Inventor: Toshiaki Sugiyama, Tokyo, Japan
[73] Assignee: NEC Corporation, Japan
[21] Appl. No.: 975,826
[22] Filed: Nov. 13, 1992
[30] Foreign Application Priority Data Nov. 14, 1991 [JP] Japan ................................ 3-326454

[51] Int. Cl.⁵ .......................................... H01J 37/317
[52] U.S. Cl. .............................. 250/492.21; 250/398; 250/397
[58] Field of Search ..................... 250/492.21, 398, 397

[56] References Cited
U.S. PATENT DOCUMENTS 4,633,138 12/1986 Tokiguchi et al. ............. 250/492.21
4,922,106 5/1990 Berrian et al. ................. 250/492.21
5,068,539 11/1991 Nogami et al. ................ 250/492.21

*Primary Examiner*—Jack I. Berman
*Attorney, Agent, or Firm*—Laff, Whitesel, Conte & Saret

[57] ABSTRACT

The invention provides a novel scanning control system of preventing any over-scanning involved in an ion-implantation apparatus accomplishing an electrostatic X-scanning and a mechanical Y-scanning. The system includes a liner detecting arrangement for detecting over-scanning comprising a horizontal and sequential alignment of plural Faraday tubes. The detecting arrangement having a larger length than a diameter of a wafer is located behind the wafer mounted on a platen. The system also includes an X-scanning width control feature which is electrically connected to the detecting arrangement to fetch results of over-scanning detection. The X-scanning width control feature is determinative of a frequency of X-scanning associated with a width of X-scanning and supplies X-scanning frequency control voltage signals to X-deflector electrode plates making a pair thereby preventing over-scanning. The system further includes a Y-scanning speed control feature for controlling a speed of Y-direction movement of the wafer according to the frequency of the X-scanning thereby securing an uniformity of ion-implantation to the wafer.

7 Claims, 2 Drawing Sheets

SCANNING CONTROL SYSTEM INVOLVED IN AN ION-IMPLANTATION APPARATUS

BACKGROUND OF THE INVENTION

The invention relates to an ion-implantation apparatus of a sheet type, and more particularly to an ion-beam scanning control feature involved in an ion-implantation apparatus of a parallel scanning type which accomplishes an electrostatic X-scanning of an ion-beam and mechanical Y-scanning.

In general, the sheet type of ion-implantation apparatus has been used for ion-implantation in a medium current region. Such sheet type ion-implantation apparatus may be divided into the following two types. One is an electrostatic scanning type of ion-implantation apparatus which accomplishes X-electrostatic scanning and Y-electrostatic scanning of ion-beams at predetermined frequencies respectively. Another is a parallel scanning type ion-implantation apparatus which accomplishes X-electrostatic scanning of the ion-beam and mechanical Y-scanning at predetermined frequencies respectively.

In the prior art, such a parallel scanning type of ion-implantation apparatus has the following structures. With reference to FIG. 1, the conventional structure of the ion-beam scanning control feature involved in the parallel scanning type ion-implantation apparatus has a platen 2 on which a wafer 1 is provided. The platen 2 is supported by a Y-scanning feature 3 so as to be movable in the vertical direction, or Y-direction thereby accomplishing the mechanical Y-scanning in the vertical direction.

In contrast to such a mechanical scanning in the Y-direction, the ion-beam 5 scans in the X-direction at a predetermined frequency (typically about 500 Hz) in the horizontal direction, controlled by an electrostatic scanning system which employs a pair of X-deflector electrode plates 4. Further, such a conventional structure of the ion-beam scanning control includes two Faraday tubes 6 serving as detecting elements, which are arranged at diametrically opposite sides approximately and behind the platen 2. The Faraday tubes 6 are supported to be in separation from the platen 2 which is movable in the vertical direction. Faraday tubes 6 catch the ion-beam and makes a measurement of a current generated by the ion-beam 5.

The operation of the ion-beam scanning control feature involved in the parallel scanning type ion-implantation apparatus will be described with reference to FIG. 1. The ion-beam 5 is transmitted to the wafer 1 on the platen 2 via a space defined by a pair of the X-deflector electrode plates 4. The ions having a predetermined average energy supplied by the ion-beam 5 are implanted into the wafer 1. The X-scanning of the ion-beam 5 has a predetermined frequency which is controlled by voltage signals applied to the X-deflector electrode plates 4. The Y-scanning feature 3 moves the platen 2 on which the wafer 1 is supported in the Y-direction, or vertical direction thereby accomplishing the mechanical Y-scanning.

The problem with such X-scanning by the ion-beam 5 is an over-scanning which provides unnecessary ion-beams to which external area and thus an opposite areas beyond the surface of the wafer 1 is subjected. To prevent such over-scanning, the conventional apparatus includes a feature for detecting the over scanning. In the X-scanning controlled by a pair of the X-deflector electrode plates 4, if there is any over-scanning of the ion-beam 5, which has a larger scanning width than the diameter of the wafer 1, the Faraday tubes 6 catches the over-scanning ion-beams. Hence, the Faraday tubes 6 detect the over-scanning. When the over-scanning of the ion-beam 5 is detected by the Faraday tubes 6, voltage signals are applied to a pair of the X-deflector electrode plates 4 which provide a predetermined scanning frequency. The scanning frequency provided by such X-deflector electrode plates 4 is determinative of the scanning width of the ion-beam 5 in the X-direction, or the horizontal direction so as to limit the scanning width of the ion-beam 5 to the diameter of the wafer 1 supported on the platen 2. As a result, such scanning ion-beam 5 has an uniformity in the X-scanning width which is defined by the distance between the two Faraday tubes 6.

Although the wafer 1 is circular, such a scanning area of the ion-beam 5 is defined into a square to internally touch the circle defined by the wafer 1. Since the wafer 1 which is subjected to the ion-implantation is circular, such conventional ion-beam scanning having the uniformity in the X-scanning width and thus having a square ion-implantation area is forced to have unnecessary over-scanning of such square area. Then, four corner areas in the square ion-implantation area except for an overlapping area to the wafer is subjected to the over-scanning of the ion-beam. It is, therefore, necessary to develop a novel scanning control feature which is free from any over-scanning, or unnecessary scanning. Further, such over-scanning to the external area to the wafer requires an unnecessary time for an ion-implantation process. It is, thus, desirable to prevent any over-scanning.

SUMMARY OF THE INVENTION

Accordingly, it is a primary object of the present invention to provide a novel scanning control feature involved in an ion-implantation apparatus.

It is a further object of the present invention to provide a novel scanning control feature involved in an ion-implantation apparatus, which prevents an unnecessary scanning, or a over-scanning of ion-beam.

It is a still further object of the present invention to provide a novel control feature of an electrostatic X-scanning by an ion-implantation apparatus, which prevents an unnecessary scanning, or a over-scanning of ion-beam.

It is yet a further object of the present invention to provide a novel control feature of an electrostatic X-scanning in an ion-implantation apparatus, which provides a substantial time reduction of the ion-implantation to a wafer.

The above and other objects, features and advantages of the present invention will be apparent from following description.

The present invention essentially provides a novel scanning control system involved in an ion-implantation apparatus which accomplishes an electrostatic X-scanning and a mechanical Y-scanning. The novel scanning control system includes a platen which mounts a wafer which is to be subjected to ion-implantation. The platen mounting the wafer is supported by a Y-scanning feature so as to be movable in a Y-direction.

The novel scanning control system also includes an improved detecting arrangement which detects an over-scanning of the ion-beam to which an external area and thus opposite area to the wafer is subjected. The detecting arrangement essentially comprises a line segment having a larger width than a diameter of the wafer. The detecting arrangement is located behind the wafer at the same level position as an ion-beam level position. For example, the detecting arrangement may comprise a horizontal and sequential alignment of a plurality of detecting elements such as Faraday tubes. The detecting elements such as the Faraday tubes make a measurement of a current generated by over-scanning ion-beam.

The novel scanning control system also includes an X-scanning width control feature for controlling an X-scanning width of ion-beam. The X-scanning width control feature is electrically connected to the detecting arrangement, such as the alignment of Faraday tubes, to give over-scanning electrical detection signals from the detecting arrangement. The X-scanning width control feature is determinative of a frequency of the X-scanning of ion-beam according to the results of the over-scanning detection. The X-scanning width is associated with the frequency of the X-scanning due to a constant X-scanning speed. The X-scanning width control feature supplies the X-deflector electrode plates with frequency control voltage signals which are determinative of the frequency of the X-scanning of ion-beam, and thus the width of the X-scanning. As a result, the X-scanning width is always controlled to correspond to a horizontal length of a portion of the circular shaped wafer which is subjected to ion-beam, although the wafer is mechanically moved in the Y-scanning direction.

The novel scanning control system further includes a Y-scanning speed control feature for controlling the speed of Y-direction movement of the wafer mounted on the platen. The Y-scanning speed control feature is electrically connected to the X-scanning width control feature so as to receive information about the frequency of the X-scanning of ion-beam. The Y-scanning speed control feature is determinative of the Y-scanning speed according to the information of the frequency of the X-scanning and supplies Y-scanning speed control signals to the Y-scanning features which supports the platen mounting the wafer. The Y-scanning feature receives the Y-scanning speed control signals and controls the Y-scanning speed to provide a desirable ion-implantation having an uniformity in a dopant concentration.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
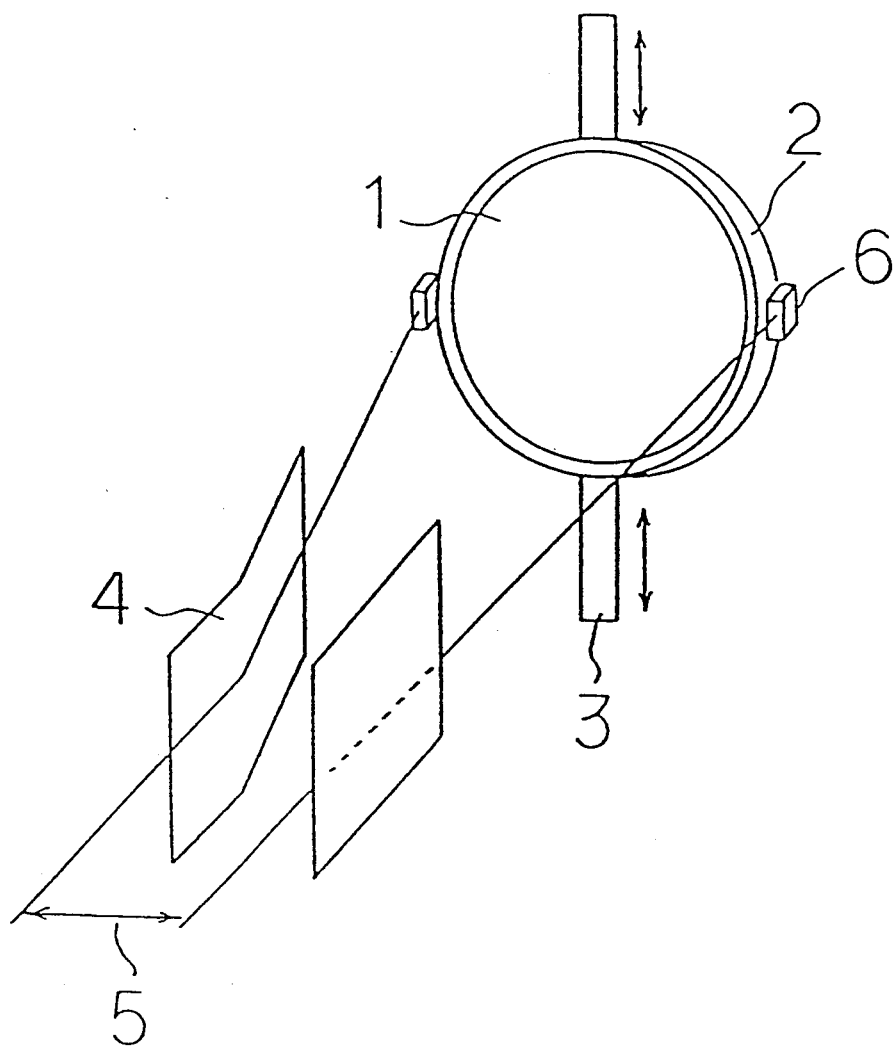
FIG. 1 is a schematic and perspective view illustrative of a structure of the conventional scanning control feature of ion beams involved in the ion-implantation apparatus.
Figure 2:
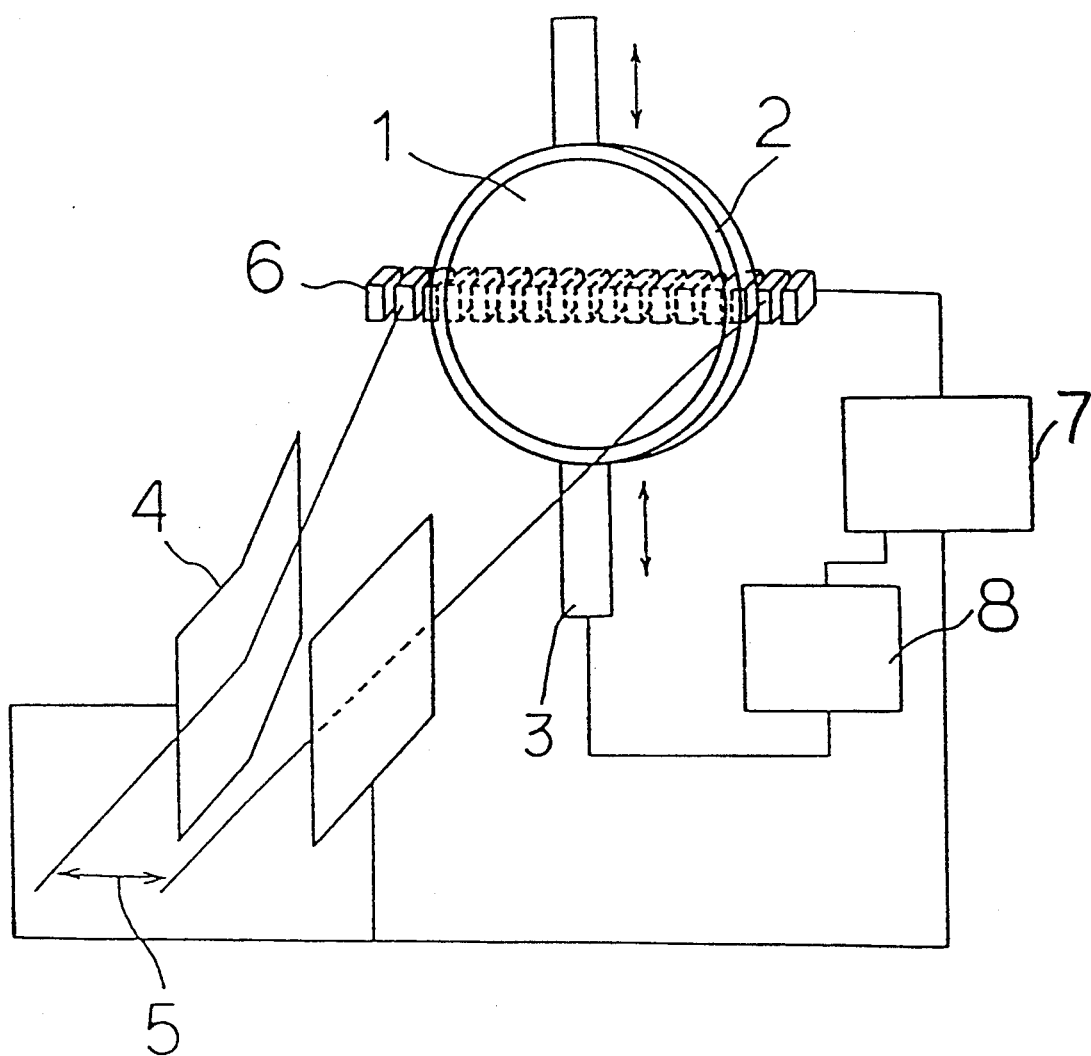
FIG. 2 is a schematic and perspective view illustrative of a structure of a novel scanning control feature of ion-beams involved in an ion-implantation apparatus.

The present invention provides an improved parallel scanning type ion-implantation apparatus, in which an X-scanning in the horizontal direction is accomplished by an electrostatic scanning and a Y-scanning in the vertical direction is accomplished by a mechanical scanning. Further, the present invention essentially provides a novel control feature of the electrostatic X-scanning involved in the parallel scanning type ion-implantation apparatus, which prevents unnecessary scanning, or over-scanning of an ion-beam 5. A preferred embodiment of the present invention will now be described in detail with reference to FIG. 2.

An improved parallel scanning type ion-implantation apparatus includes a novel ion-beam scanning control feature. The structure of the novel ion-beam scanning control feature has a platen 2 on which a wafer 1 is provided. The platen 2 is supported by a Y-scanning feature 3 to move in the vertical direction, or Y-direction thereby accomplishing the mechanical Y-scanning in the vertical direction.

In contrast to such mechanical Y-scanning, an X-scanning of the ion-beam 5 in the horizontal direction is accomplished by the electrostatic scanning which employs a pair of X-deflector electrode plates 4. The ion-beam 5 is transmitted to the surface of the wafer 1 on the platen 2 via a space between the pair of X-deflector electrode plates 4. The X-deflector electrode plates 4 receive a voltage signal which is determinative of and controls a frequency of the X-scanning of the ion-beam 5. Such an electrostatic X-scanning of the ion-beam 5 is also accomplished at a predetermined frequency.

Further, such a novel structure of the ion-beam scanning control feature includes a detecting arrangement which is shaped into a horizontal line segment. The detecting arrangement detects the ion-beam, for instance, and makes a measurement of a current generated by the ion-beam 5. Such a detecting arrangement may comprises a horizontal and sequential alignment of a plurality of Faraday tubes 6, each of which serves as a detecting element for the ion-beam 5. Each of the plurality of Faraday tubes 6 catches the ion-beam 5 and makes a measurement of a current generated by the ion-beam 5. In this embodiment, seventeen Faraday tubes 6 are used to form the detecting arrangement of the line segment, although it is by all means required to do so. Then, the number of the Faraday tubes 6 is variable.

Such a detecting arrangement comprises the horizontal and sequential alignment of the seventeen Faraday tubes 6 located behind the platen 1 including the wafer 1. Such a detecting arrangement comprising the horizontal and sequential alignment of the seventeen Faraday tubes 6 also has a predetermined length which is larger than the diameter of the circular shaped wafer 1. As a result, at least opposite terminal Faraday tubes 6 involved in the alignment of the seventeen Faraday tubes 6 always exist at an outside of the platen 2 including the wafer 1 at any positions of the platen 2 in the Y-direction, or the vertical direction. The detecting arrangement comprising the horizontal and sequential alignment of the seventeen Faraday tubes 6 are supported at the same level position as a level position of the ion-beam 5, the scanning of which is the horizontal scanning only. The vertical scanning, or the Y-scanning is accomplished by vertically moving the platen 2 including the wafer 1. Thus, the detecting arrangement comprising the horizontal and sequential alignment of the seventeen Faraday tubes 6 is as supported as to be separated from the platen 2 including the wafer 1 which is movable in the vertical direction.

In addition, such a novel structure of the ion-beam scanning control feature includes an X-scanning width control circuit 7 which is electrically connected to the detecting arrangement comprising the horizontal and sequential alignment of the seventeen Faraday tubes 6. The X-scanning width control circuit 7 gives any detected results as electrical signals from the detecting arrangement comprising the alignment of the plural Faraday tubes 6. The X-scanning width control circuit 7 is also electrically connected to each of the X-deflector electrode plates 4. The X-scanning width control circuit 7 supplies X-scanning width control voltage signals to the X-deflector electrode plates 4 in accordance with the electrical signals serving as the detected results given by the detecting arrangement comprising the alignment of the plural Faraday tubes 6. The X-scanning width control voltage signals applied to the X-deflector plates 4 is determinative of a preferable frequency of the X-scanning of the ion-beam 5 which is transmitted approximately parallel to and though the space between the X-deflector electrode plates 4.

Furthermore, such a novel structure of the ion-beam scanning control includes a Y-scanning speed control circuit 8 which is electrically connected to the X-scanning width control circuit 7. The Y-scanning speed control feature 8 receives any electrical signals from the X-scanning width control circuit 7. The Y-scanning speed control circuit 8 is also electrically connected to the Y-scanning control circuit which supports and moves the platen 2 including the wafer 1 in the vertical direction.

As above described, the X-scanning width control circuit 7 supplies the X-deflector electrode plates 4 with X-scanning width control voltage signals which are determinative of and control the frequency of the X-scanning of the ion-beam 5. Concurrently, the X-scanning width control circuit 7 supplies the X-scanning width control voltage signals to the Y-scanning speed control circuit 8. Thus, the Y-scanning speed control circuit 8 supplies Y-scanning speed control electrical signals to the Y-scanning feature 3 in accordance with the X-scanning width control voltage signals given by the X-scanning width control circuit 7. As a consequence, the Y-scanning speed control electrical signals are determinative of and control the Y-scanning speed in association with the frequency of the X-scanning of the ion-beam 5 which is determined and controlled by the X-scanning width control voltage signals.

The operation of the novel ion-beam scanning control feature in the parallel scanning type ion-implantation apparatus will subsequentially be described.

In the improved parallel scanning type ion-implantation apparatus, the mechanical Y-scanning in the vertical direction is accomplished with using the Y-scanning feature which vertically movies the platen 2 including the wafer 1. In contrast to the mechanical Y-scanning, the X-scanning in the horizontal direction is accomplished by the electrostatic scanning of the ion-beam 5. The scanning of the ion-beam 5 has only the X-component. The ion-beam is transmitted to the surface of the wafer 1 provided on the platen 2 through the space between the X-deflector electrode plates 4. The X-deflector electrode plates 4 receive the X-scanning width control voltage signals which cause an alternating electric field at the space between the X-deflector electrode plates 5. The ion-beam 4 is transmitted perpendicular to the direction of the electric field, and thus in parallel with the X-deflector electrode plates 4.

The frequency of the electric field generated between the X-deflector electrode plates 4 is determinative of the frequency of the X-scanning of the ion-beam 5. The frequency of the X-scanning of the ion-beam 5 is determinative of the width of the X-scanning of the ion-beams 5. Thus, the frequency and the width of the X-scanning of the ion-beam 5 is defined by the X-scanning width control voltage signals applied to the X-deflector electrode plates 4.

It is desirable to prevent any unnecessary ion-beam scanning to an external area, and thus to an area opposite to the wafer 1. The implementation of a desirable ion-implantation without unnecessary ion-beam scanning requires the novel scanning control feature to precisely and speedy control the frequency and the width of the X-scanning in association with the vertical position of the platen 2 including the wafer 1.

Since the wafer 1 is circularly shaped, the horizontal length of the wafer 1 is variable in dependence upon the vertical position, or the Y-position. It is, thus, necessary that the X-scanning width of ion-beam 5, which depends upon the frequency is controlled to correspond to the horizontal length of the wafer 1 in accordance with the Y-position, or the vertical position of the platen 2 including the wafer 1.

When the platen 2 including the wafer 1 exists at a Y-position, a horizontal length which is in the same level as the ion-beam X-scanning level of the wafer 1 is defined. Any normal X-scanning makes the circular shaped wafer 1 subject to the ion-beam 5. If any over-scanning, to which the external area, and thus the opposite area to the wafer 1 is subjected, occurs, the ion-beam 5 is caught and detected by the detecting arrangement comprising the horizontal and sequential alignment of the plural Faraday tubes 6. For example, any Faraday tubes 6 catches the ion-beam 5 and makes a measurement of a current generated by the ion-beam 5, thereby detecting such over-scanning. It is necessary to promptly suppress such over-scanning.

The detecting arrangement comprising the horizontal and sequential alignment of the plural Faraday tubes 6 transmits the detecting results concerning the over-scanning of the ion-beam 5 as electrical signals to the X-scanning width control signal circuit 7. The X-scanning width control circuit 7 give the result of the detection of the ion-beam over-scanning as the electrical signals from the detecting arrangement comprising the horizontal and sequential alignment of the plural Faraday tubes 6. The X-scanning width control circuit 7 supplies X-scanning width control voltage signals to the X-deflector electrode plates 4 in accordance with the electrical signals serving as the detected results of the over-scanning of the ion-beam 5.

The X-scanning width control voltage signals applied to the X-deflector plates 4 are determinative of a preferable frequency of the X-scanning of the ion-beam 5 which provides a suitable X-scanning width corresponding to the horizontal length of the wafer 1 at the same level as the scanning ion-beam. When the X-scanning width of the ion-beam 5 is controlled to correspond the horizontal length of the wafer 1, the detecting arrangement comprising the alignment of the plural Faraday tubes 6 are no longer able to catch the ion-beam 5, and thus to make the detection of the over-scanning of the ion-beam 5. In this case, all of the scanning ion-beam 5 is applied to the wafer 1. Consequently, the detecting arrangement makes a measurement of zero current produced by the ion-beam 5.

Further, the ion-implantation to the wafer 1 is required to have a uniformity in a dopant concentration. The Y-scanning feature 3 supporting the platen 2 including the wafer 1 requires a control of the Y-scanning speed in association with the frequency of the X-scanning. Preferably, the X-scanning speed remains at a predetermined value in order to realize the ion-implantation to the wafer 1 having a uniformity of the dopant concentration. The uniformity of the ion-implantation to the wafer 1 is accomplished by controlling the mechanical Y-scanning speed which is provided by the vertical movement of the wafer 1.

In general, as the horizontal length of the wafer 1 which is subjected to the ion-beam 5 becomes shorter, the width of the X-scanning is controlled to also become shorter so that the width of the X-scanning corresponds to the horizontal length of the wafer 1. As the width of the X-scanning becomes shorter, the frequency of the X-scanning is forced to become higher due to a constant X-scanning speed. The high frequency X-scanning requires a high Y-scanning speed provided by the Y-scanning feature 3 in order to secure the uniformity of the ion-implantation to the wafer 1. It is, therefore, necessary that the Y-scanning speed be controlled depending upon the frequency of the ion-beam X-scanning which is defined by the X-scanning width control signals.

The X-scanning width control control 7 supplies the X-scanning width control voltage signals to not only the X-deflector electrode plates 4, but also the Y-scanning speed control control 8. The Y-scanning speed control control 8 receives the X-scanning width control voltage signals and determines a preferable Y-scanning speed in accordance with the X-scanning width, and thus the frequency of the ion-beam X-scanning which is determined according to the Y-position of the wafer 1.

The Y-scanning speed control circuit 8 supplies the Y-scanning feature 3 with Y-scanning speed control signals which provides the preferable Y-scanning speed. The Y-scanning feature 3 receives the Y-scanning speed control signals and moves the platen 2 vertically, including the wafer 1, at a preferable speed according to the Y-scanning speed control signals thereby securing the uniformity of the ion-implantation to the wafer 1.

Such a vertical movement of the wafer 1 provided by the Y-scanning feature 3 varys the vertical position of the wafer 1. The portion of the wafer 1 which is subjected to the ion-beam 5 is also varied with the vertical movement of the wafer 1. Consequently, the horizontal length of the portion of the wafer 1 which is subjected to the ion-beam 5 is varied. Then, the width of the X-scanning is controlled to correspond to the horizontal length of the wafer 1 by the X-scanning width control circuit 7.

From the set forth descriptions, the following matters will no doubt be apparent. Since the detecting arrangement for the ion-beam 5 comprises a horizontal line segment, for instance, a horizontal and sequential alignment of the plurality of detecting elements, such as the Faraday tubes 6, the undesirable over-scanning of the external area to the circular shaped wafer 1 is always and securely detected at any vertical positions, or Y-positions of the wafer 1. The X-scanning width control circuit makes a control of the width of the ion-beam X-scanning correspond to the horizontal length at a level of the wafer 1 which is subjected to the ion-implantation. This prevents the over-scanning of the ion-beam 5 to the external and thus the opposite areas beyond the circular shaped wafer 1. Further, the Y-scanning speed control circuit 8 controls the Y-scanning speed, and thus the speed of the vertical movement of the wafer thereby accomplishing a desirable ion-implantation to the wafer 1 having an uniformity in the dopant concentration.

Eventually, the novel scanning control feature involved in the parallel scanning type ion-implantation apparatus implements the self-controlled electrostatic X-scanning and mechanical Y-scanning. Actually, the prevention of the undesirable over-scanning to the external, or opposite area beyond the wafer 1 is able to provide a time reduction of 20% to the ion-implantation as compared with the prior art.

Whereas modifications of the present invention will no doubt be apparent to a person of ordinary skilled in the art, it is to be understood that the embodiments shown and described by way of illustration are by no means intended to be considered in a limiting sense. Accordingly, the claims should be construed to cover all modifications of the invention which fall within the sprit and scope of the invention.

What is claimed is:

1. A scanning control system involved in an ion-implantation apparatus which accomplishes an electrostatic X-scanning and a mechanical Y-scanning, said scanning control system comprising:
    means for mounting a wafer, said mounting means being movable in a Y-direction;
    means located behind said wafer at the same level position as an ion-beam level position for detecting an over-scanning of ion-beam, said detecting means comprising a horizontal line segment having a predetermined length larger than a diameter of said wafer; and
    means electrically connected to said detecting means for controlling an X-scanning width of ion-beam according to results of said over-scanning detection fetched from said detecting means.

2. The scanning control system involved in an ion-implantation apparatus as claimed in claim 1, wherein said X-scanning width control means comprises an X-scanning width controller and an X-deflector electrodes, said X-scanning width controller being determinative of a frequency of X-scanning of ion-beam and supplying frequency control voltage signals to said X-deflector electrodes.

3. The scanning control system involved in an ion-implantation apparatus as claimed in claim 1, further comprising means electrically connected to said X-scanning width control means and mechanically connected to said mounting means for controlling a Y-scanning speed possessed by a Y-direction movement of said wafer in association with said X-scanning width control signals.

4. The scanning control system involved in an ion-implantation apparatus as claimed in claim 3, wherein said Y-scanning speed control means comprises a Y-scanning speed controller and a Y-scanning feature for moving said mounting means in said Y-direction, said Y-scanning speed controller being determinative of a speed of a Y-direction movement of said wafer and supplying speed control electrical signals to said Y-scanning feature.

5. The scanning control system involved in an ion-implantation apparatus as claimed in claim 1, wherein said detecting means comprises a horizontal and sequential alignment of a plurality of detecting elements for making a measurement of a current generated by over-scanning of ion-beam.

6. The scanning control system involved in an ion-implantation apparatus as claimed in claim 5, wherein said detecting element comprises a Faraday tube.

7. The scanning control system involved in an ion-implantation apparatus as claimed in claim 1, wherein said mounting means comprises a platen.

* * * * *